United States Patent [19]
Hill

[11] Patent Number: 5,905,684
[45] Date of Patent: May 18, 1999

[54] MEMORY BIT LINE OUTPUT BUFFER

[75] Inventor: Stephen John Hill, Austin, Tex.

[73] Assignee: ARM Limited, Cambridge, United Kingdom

[21] Appl. No.: 08/962,641

[22] Filed: Nov. 3, 1997

[51] Int. Cl.$^6$ .................................................. G11C 7/00
[52] U.S. Cl. .............. 365/203; 365/230.08; 365/185.25; 365/189.05
[58] Field of Search ............................... 365/203, 185.25, 365/154, 189.05, 205, 230.05, 230.08

[56] References Cited

U.S. PATENT DOCUMENTS

| | | | |
|---|---|---|---|
| 4,144,590 | 3/1979 | Kitagawa et al. ....................... | 365/205 |
| 4,397,000 | 8/1983 | Nagami .................................... | 365/189 |
| 5,325,330 | 6/1994 | Morgan ................................. | 365/189.05 |
| 5,481,500 | 1/1996 | Reohr et al. ............................. | 365/203 |
| 5,740,115 | 4/1998 | Ishibashi et al. ........................ | 365/203 |

Primary Examiner—David Nelms
Assistant Examiner—Tuan T. Nguyen
Attorney, Agent, or Firm—Nixon & Vanderhye P.C.

[57] ABSTRACT

The present invention provides an output buffer 38 for the signal from a bit line 16 that is precharged by a precharging gate 34. The output buffer 38 comprises a stack of field effect transistors made up of an isolation transistor 40 switched by a clock signal indicating the precharge period, a precharge state driver transistor 42 and a non-precharge state driver transistor 44. The non-precharge state driver transistor 44 is connected directly between the output signal line of the output buffer and the ground. The two driver transistors 42,44 are of different polarities and are switched by the bit line signal. In operation, during the precharge period, the precharge state driver transistor 42 is disabled from changing the output of the output buffer 38 by the isolation transistor 40 whilst the non-precharge state driver transistor 44 is disabled by the transition to or maintenance of the precharge signal value on the bit line 16.

11 Claims, 6 Drawing Sheets

READ "1"

READ "1"

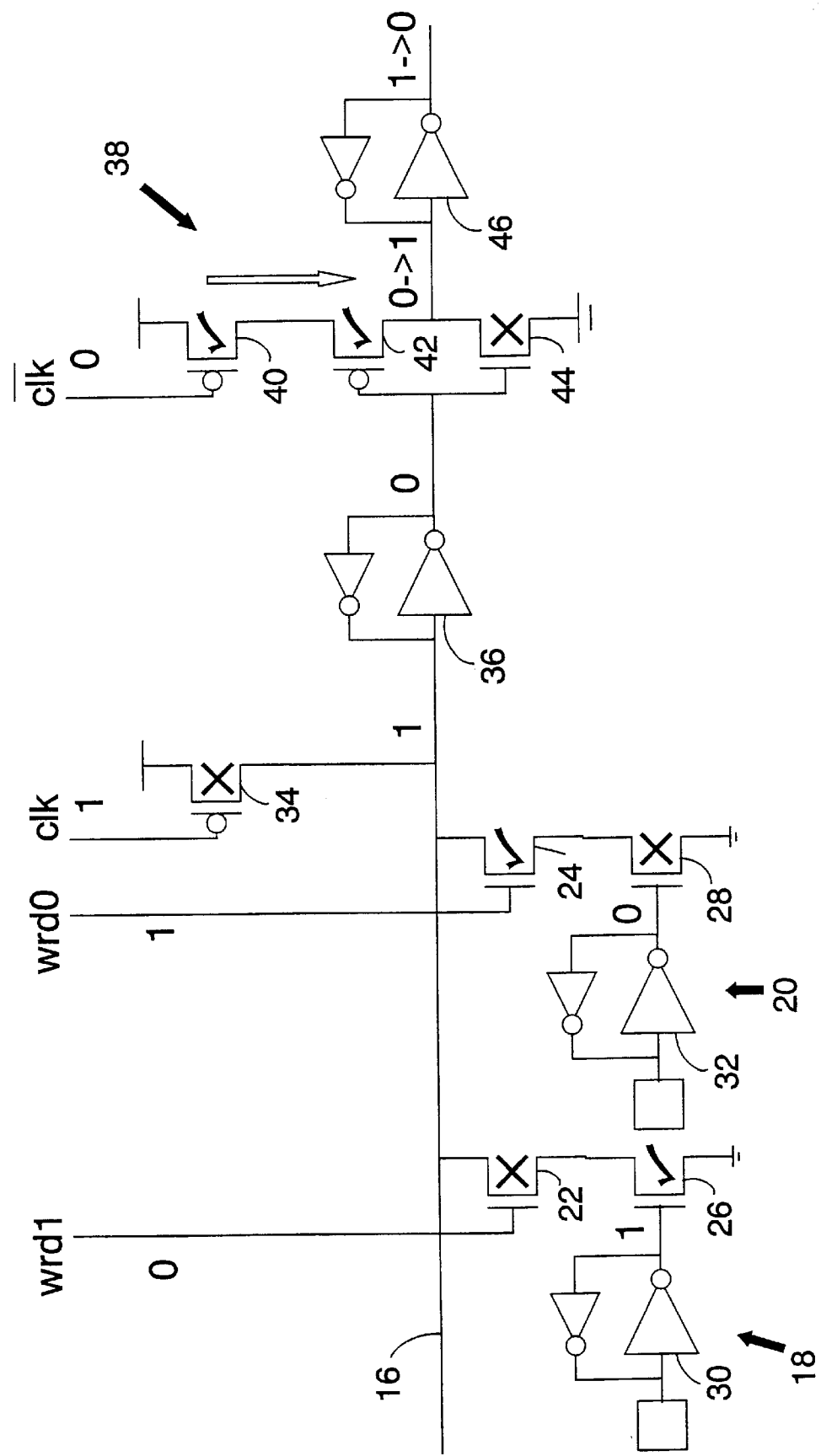
Fig.5 READ "0"

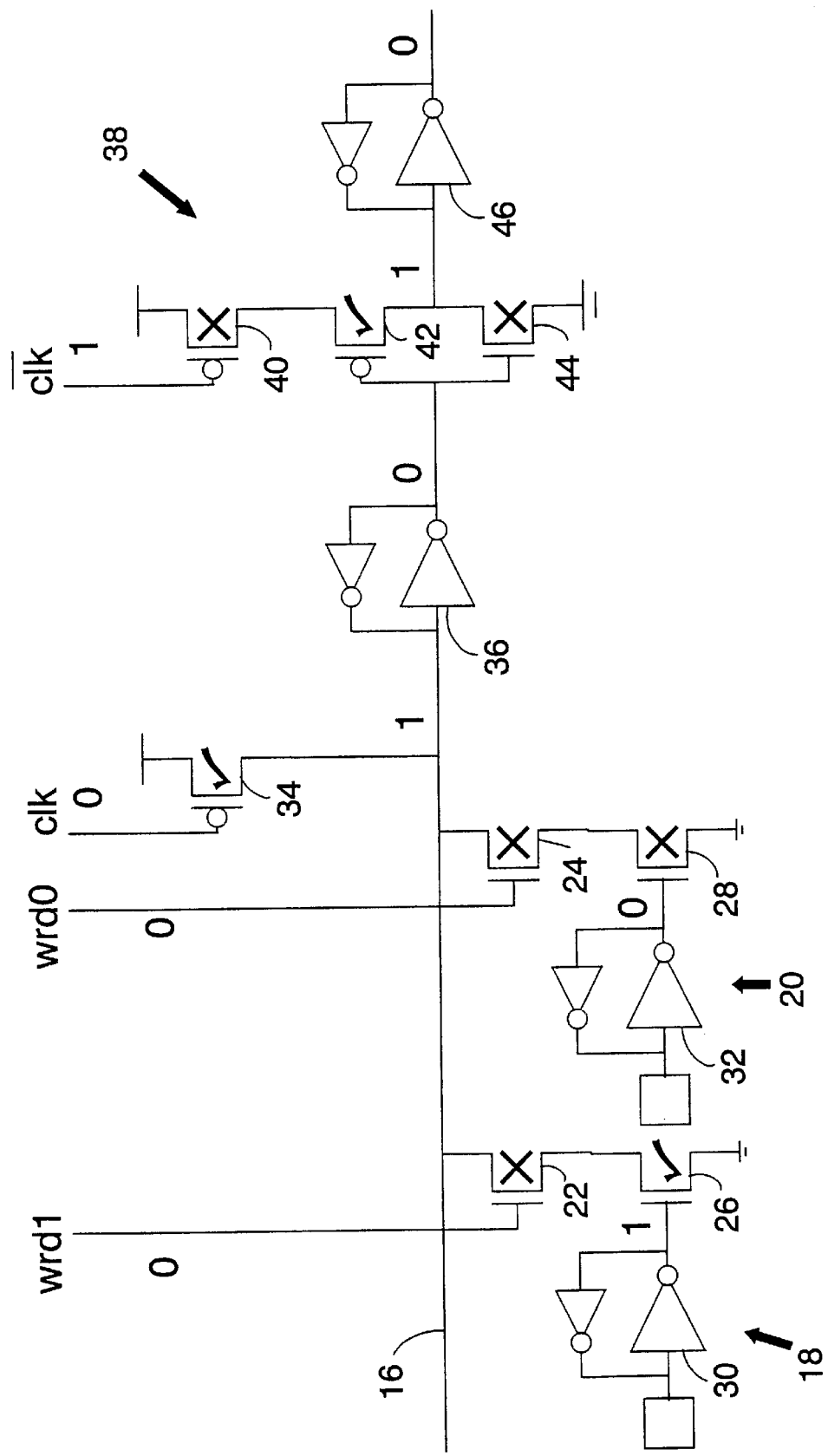
Fig.6  PRECHARGE AFTER "0"

MEMORY BIT LINE OUTPUT BUFFER

BACKGROUND OF THE INVENTION

1. Field of the Invention

The present invention relates to data processing apparatus, and in particular to data processing apparatus including memory cells accessed via bit lines.

2. Description of the Prior Art

It is known in the field of data processing systems to provide a memory, such as registers within a register bank, a cache memory or main memory, with bit lines running through the memory and via which data values are recovered from a chosen data storage cell within the memory. The bit lines within such memory are typically precharged during a precharge cycle to a given voltage and then selectively discharged by the chosen data storage cell in dependence upon whether the data storage cells is holding a "0" or a "1". A problem associated with bit lines is that they have a relatively large capacitance and so can take a comparatively long time to precharge and then selectively discharge. This can limit the cycle time of the system. In addition, when reading data values from data storage cells, it is important that they should be available and well defined by a certain point within the processing cycle. For these reasons, the length of time the bit line can spend bearing a signal value moving between those representing a well defined "0" or "1" is a problem.

In order to resolve some of these problems it is known to use tri-state output buffers at the outputs of a bit line such that the signal value on the bit line can be captured at a well defined time and variations of the signal value following the time at which the tri-state buffer can be prevented from influencing the output signal downstream of the tri-state buffer.

It is a constant aim within data processing systems to reduce the power consumption of the processors and the size of the circuits required. Low power consumption is highly desirable to extend battery life in portable systems and to allow faster operation without overheating.

FIGS. 1A, 1B, 2A and 2B of the accompanying drawings illustrate a tri-state output buffer 4. A bit line 2 connected to data storage cells (not shown) provides an input to the tri-state buffer 4. The tri-state buffer 4 is formed of a stack of four field effect transistors connected between the supply rail voltage and ground. The two transistors 6,8 nearest the supply voltage are p-type transistors. The two transistors 10,12 nearest the ground voltage are n-type transistors. Upstream of the tri-state buffer 4 is a storage element 14 formed of two inverters. the transistors 8,10 are supplied respectively when an enable signal that is low for the precharge phase of the clock cycle for the p-type transistors 8 and high for the n-type transistors 10. These two transistors 8,10 accordingly serve to isolate the signal on the bit line 2 from the storage element 14 during the precharge cycle. The transistors 6,12 serve as an inverter when the tri-state buffer 4 is not in its high impedance state to pass the bit line signal to the storage element 14.

FIG. 1A shows the tri-state buffer 4 in its transmissive state with the transistors 8,10 switched on. In this case a bit line signal value of "1" turns on the transistor 12 and turns off the transistor 6. Thus, a output signal value of "0" is passed to the input of the storage element 14. The output from the storage element 14 is inverted compared to its input and so the storage element output signal is a "1" that correctly reflects the bit line signal value.

FIG. 1B shows the tri-state buffer 4 in its transmissive condition with in this case a bit line signal value of "0". The transistors 8,10 are again switched on. The bit line signal value "0" in this case turns on the transistor 6 whilst the transistor 12 is switched off.

FIG. 2A shows the tri-state buffer 4 with the transistors 8,10 in this case switched off by the enable signals that indicate that the system is in the precharge phase of the clock cycle rather than in the read phase illustrated in FIGS. 1A and 1B. Thus, as the signal value of the bit line 2 changes from a "1" to a "0", this is not passed on to the storage element 14 which maintains its input and output values as shown in FIG. 2A.

Whilst the tri-state buffer 4 discussed above serves well in accurately capturing a bit line signal value and a known time and rendering the output immune to changes during the precharge phase, it suffers from the disadvantage of requiring two clock inputs to each tri-state buffer 4. In the context of a memory system, there are very many bit lines 2 being simultaneously read. Accordingly, the structures described above are repeated many times, for example in a register bank having 32-bit words and three read ports, this would result in 96 such tri-state buffers 4 being required. The physical space required for the six clock signal lines for these 96 tri-state buffers would require a significant circuit area. Furthermore, the need to drive the clock signal values on all of these clock lines and switch two transistors 8,10 within each tri-state buffer 4 consumes a disadvantageous amount of power.

SUMMARY OF THE INVENTION

An object of the present invention is to address the above problems.

According to one aspect, the present invention provides an apparatus for processing data, said apparatus comprising:

(i) a plurality of data storage cells;

(ii) a bit line for reading a data value from a chosen one of said plurality of data storage cells;

(iii) a precharge circuit for precharging a bit line signal upon said bit line to a precharged signal value during a precharge period, said chosen data storage cell selectively discharging said bit line signal during a read period from said precharged signal value to a non-precharged signal value in dependence upon said data value stored in said chosen data storage cell; and (iv) an output buffer for generating an output signal on a output signal line in response to said bit line signal; wherein (v) said output buffer has a precharge state driver gate serving to drive said output signal to respond to said bit line signal having said precharged signal value during said read period and an isolation gate responsive to a signal indicative of said precharge period for disabling said precharge state driver gate from altering said output signal during said precharge period of said bit line; and (vi) said output buffer has a non-precharge state driver gate connected between said output signal line and a ground signal supply having a ground signal value with no intervening switched elements responsive to a different signal, said non-precharge state driver gate serving to drive said output signal to respond to said bit line signal having said non-precharged signal value during said read period and being responsive to said bit line signal changing from said non-precharged value to said precharged value to disable said non-precharge state driver gate from altering said output signal during said precharge period of said bit line.

The present invention allows a single clock signal (signal indicative of the precharge period) to control the output buffer. The invention recognizes that the bit line signal value either maintains the precharged signal value or changes from the non-precharged signal value to the precharged signal value during the precharge period. During the precharge period, a transition from the precharged signal value to the non-precharged signal value will not occur. The absence of this possibility in fact means that the standard tri-state buffers of FIGS. 1A, 1B, 2A and 2B include a disadvantageous degree of redundancy in that they are able to block this transition that in fact never occurs. The recognition that this transition need not be taken into account allows the simplification of the output buffer circuit to require only one clock signal and require the switching of only one isolation gate. This reduces the required circuit area and the power consumption.

The skilled man in the field would be prejudiced against doing away with the two isolation transistors 8,10 of the known tri-state buffers since the comparatively long times that the bit line signal value takes to move between levels mean that it would be regarded as prudent to completely isolate the output signal at a well defined time, for example to reduce the possibility of cross-coupling noise corrupting the state. Accordingly, relying upon the non-precharge state driver gate to be disabled by the slowly changing bit line signal during the precharge period would be against standard design considerations. Surprisingly, the output buffer of the invention has been found to work without trouble and yet yields significant circuit area reduction and power consumption reduction advantages.

It will be appreciated that the output from the output buffer could be used directly, however in preferred embodiments of the invention a storage element is provided to receive the output signal from the output buffer and hold it in a fixed state.

Whilst the present invention could be used in systems having only a single bit line, the advantages of the invention are much greater in systems having a plurality of said bit lines, said precharge circuits and said output buffers, each associated with a respective plurality of data storage cells.

An example of a system in which the present invention has particular usefulness is one comprising a data processing core having a register bank formed of said data storage cells.

The register bank could have a single read port, but in practice will typically have a plurality of read ports each having an associated set of bit lines. Multiple read ports allow several to be read from the register bank simultaneously. The use of multiple read ports also makes the advantages of the invention stronger as more output buffers are required.

It is convenient within a data processing system to use the clock signal of the system to define the precharge period and the read period. The clock signal is already routed to most areas of the circuit and is well controlled and regulated. In these systems, the signal indicative of the precharge period can be directly provided by a single clock signal.

In order to improve the speed of response and voltage difference between output signal levels, in preferred embodiments of the invention said precharge state driver gate and said isolation gate are p-type field effect transistors and said non-precharge state driver gate is an n-type field effect transistor. It will be appreciated that different orders of the gates in the stack may be used.

In order to make the most of the voltage difference possible between signal levels, it is preferred that p precharge signal value is the supply voltage value and the ground signal value is taken from a ground voltage input.

Whilst the present invention could be used in embodiments formed of discrete circuit elements, the invention is particularly useful in integrated circuits.

Viewed from another aspect the present invention provides a method of operating an apparatus for processing data having a plurality of data storage cells, said method comprising the steps of:

(i) reading a data value via a bit line from a chosen one of said plurality of data storage cells;

(ii) precharging a bit line signal upon said bit line to a precharged signal value during a precharge period, said chosen data storage cell selectively discharging said bit line signal during a read period from said precharged signal value to a non-precharged signal value in dependence upon said data value stored in said chosen data storage cell; and (iii) generating an output signal with an output buffer on a output signal line in response to said bit line signal; wherein (iv) driving, with a precharge state driver gate within said output buffer, said output signal to respond to said bit line signal having said precharged signal value during said read period and, with an isolation gate responsive to a signal indicative of said precharge period, disabling said precharge state driver gate from altering said output signal during said precharge period of said bit line; and (v) driving, with a non-precharge state driver gate connected between said output signal line and a ground signal supply having a ground signal value value with no intervening switched elements responsive to a different signal and within said output buffer, said output signal to respond to said bit line signal having said non-precharged signal value during said read period, said non-precharge state driver gate being responsive to said bit line signal changing from said non-precharged value to said precharged value to disable said non-precharge state driver gate from altering said output signal during said precharge period of said bit line.

BRIEF DESCRIPTION OF THE DRAWINGS

The present invention will be described, further by way of example only, with reference to a preferred embodiment thereof as illustrated in the accompanying drawings, in which:

FIGS. 3, 4, 5 and 6 illustrate a register bank bit line output buffer circuit in accordance with one embodiment of the present invention in various operational states.

DESCRIPTION OF A PREFERRED EMBODIMENT

Figure 1B:
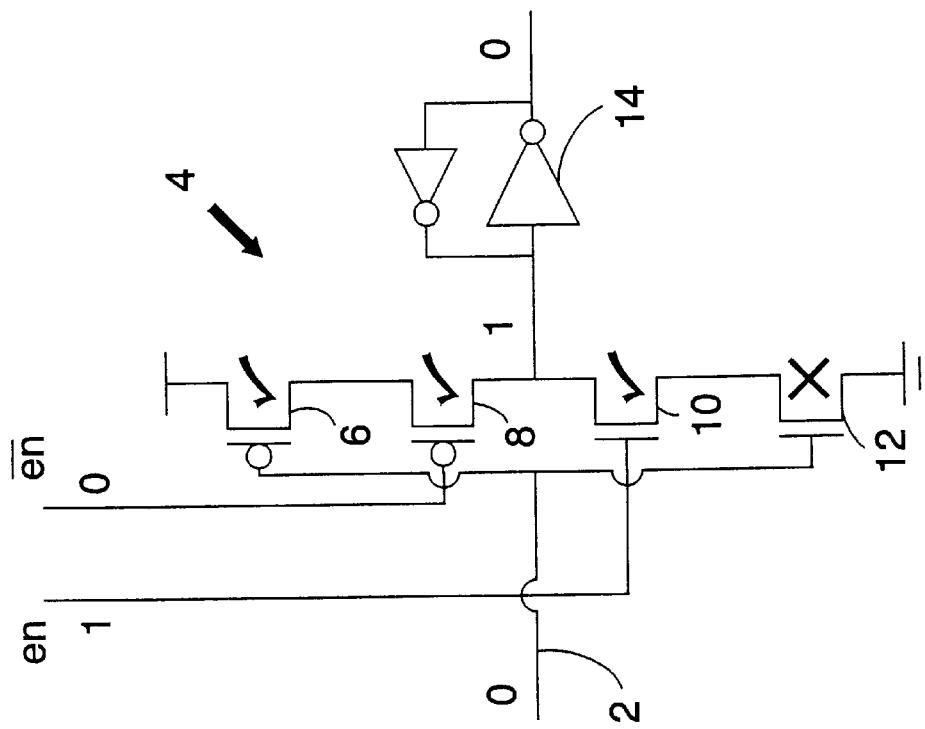
FIGS. 1A, 1B, 2A and 2B illustrate a tri-state output buffer for a bit line.
Figure 1A:
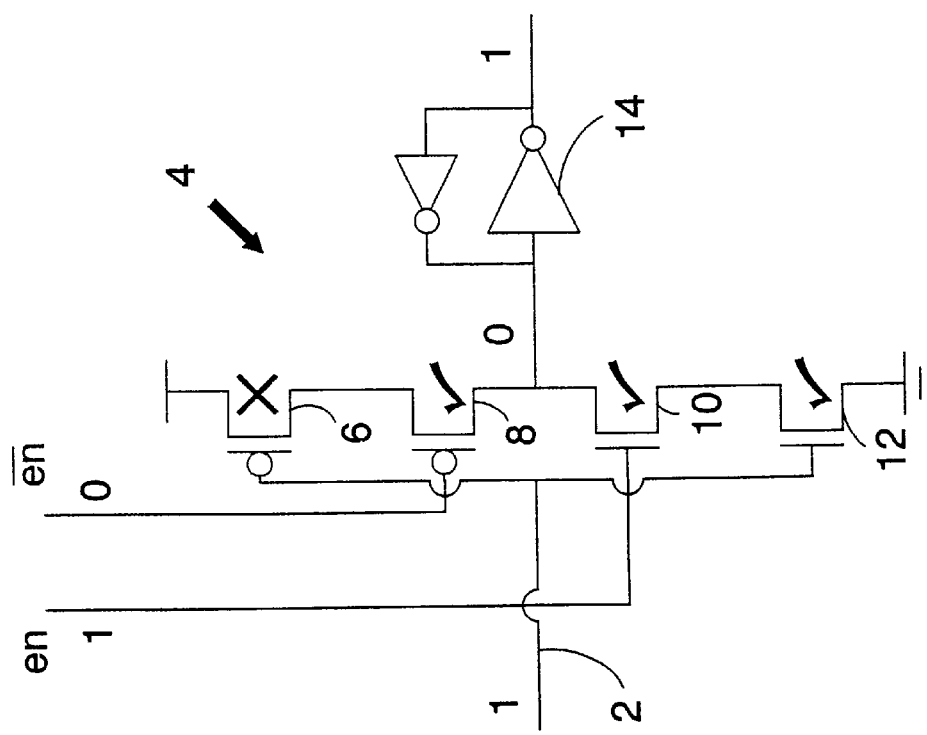
Figure 2A:
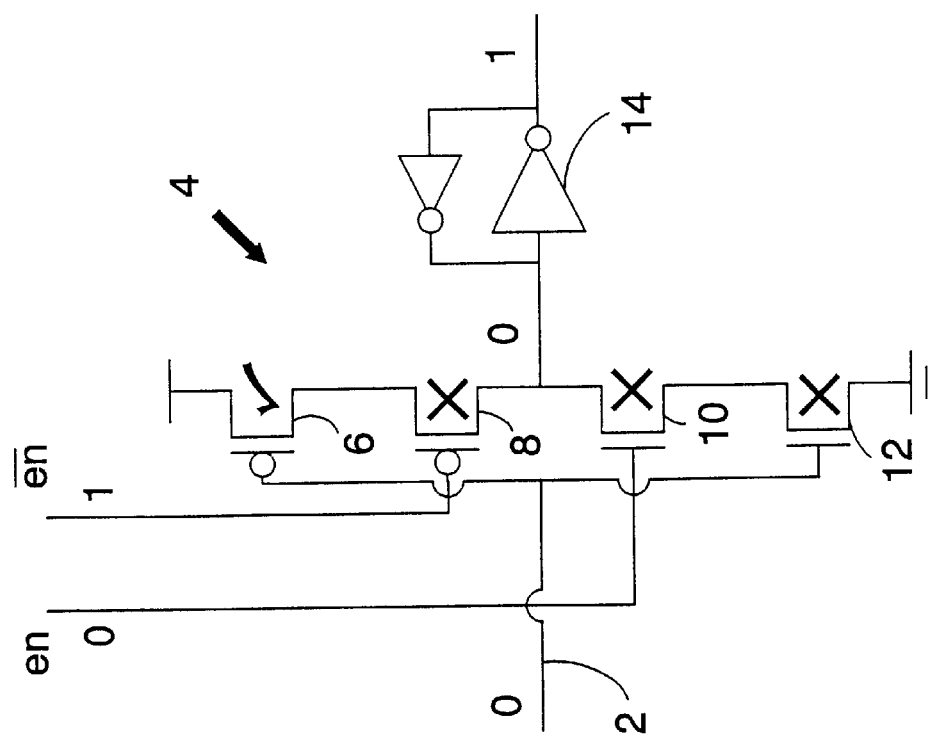
Figure 2B:
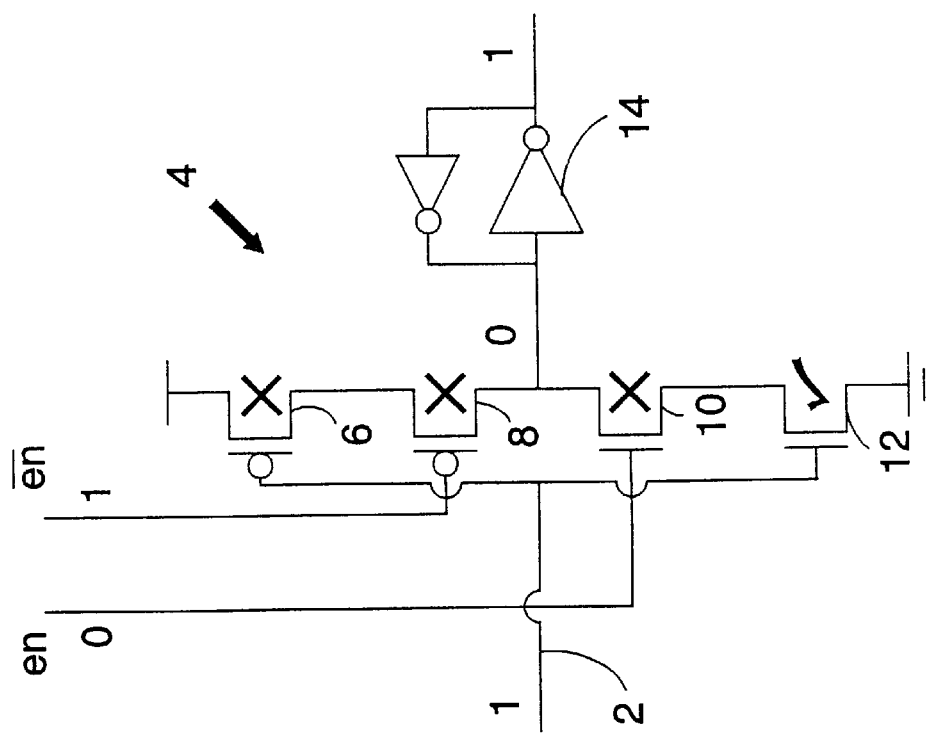
Figure 3:
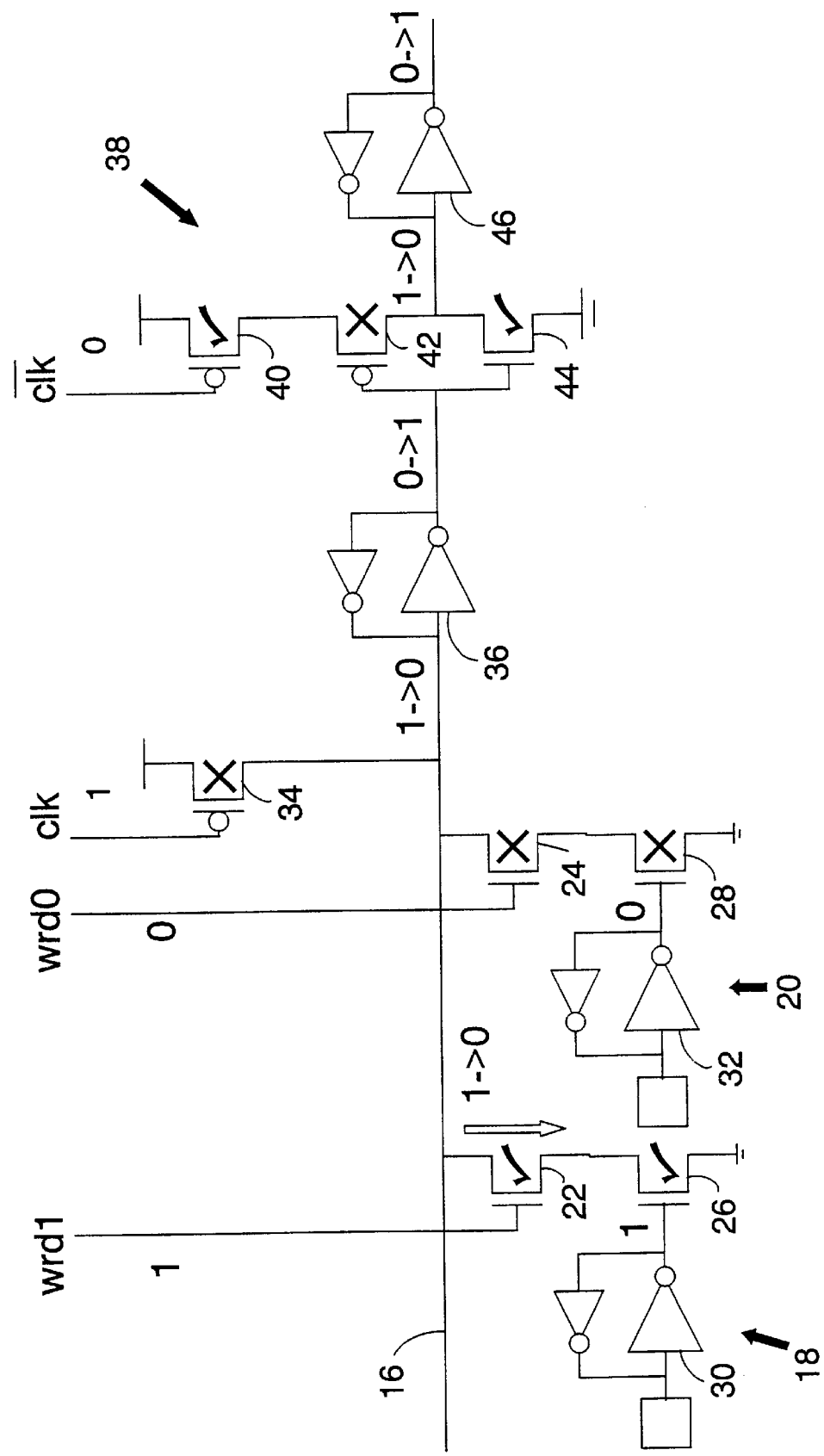

FIG. 3 shows a bit line 16 linking a plurality of data storage cells 18,20. In practice, many such bit lines 16 are provided in parallel within a register bank of a data processing core of an integrated circuit. The data storage cells 18,20 are chosen between using a word line signal wrd0, wrd1 supplied by a register number decoder.

Each data storage cell 18,20 includes a select transistor 22,24 that is switched by a respective 1 of the word line signals wrd0, wrd1. Each data storage cell 18,20 includes a discharge transistor 26,28 with a gate controlled by the data bit stored within the data storage cell 18,20. If the data bit is a "1", then when the associated select transistor 22,24 is switched on by a word line signal the precharge signal value on the bit line 16 will be discharged to ground via the select transistor 22,24 and the discharge transistor 26,28. Each data storage cell 18,20 stores the data bit statically using an inverter pair 30,32.

The relatively long length of the bit line 16 gives it a high capacitance that combines with the relatively small size of the data storage cell transistors to result in a comparatively slow discharge. In a similar way, the precharging of the bit line 16 is driven buying a single precharging transistor 34. Whilst only a single precharging transistor 34 need be provided for a whole bit line 16 and accordingly allow a relatively powerful transistor to be used, the high capacitance of the bit line 16 still results in a comparatively slow transition back to the precharged signal value.

The bit line signal passes through an invertor 36 before being supplied to the input of the output buffer circuit 38. The output buffer circuit 38 comprises a stack of three field effect transistors. These are an isolation transistor 40, a precharge state driver transistor 42 and a non-precharge state transistor 44 that are respectively formed of two p-type field effect transistors and an n-type field effect transistor. The output from the invertor 36 is passed as the input to the gate terminals of the transistors 42,44. The gate terminal of the isolation transistor 40 is supplied with the clock signal. The output signal from the output buffer 38 is passed to a storage element 46 formed of two invertors.

FIG. 3 shows the case of reading a data value of "1" from the data storage cell 18. The bit line 16 has previously been precharge to a precharged signal value of "1" by the precharge transistor 34 during a precharge phase of the clock signal. This precharge phase is now over and the precharge transistor 34 is switched off. The read phase is taking place and accordingly the isolation transistor 40 is switched on. The word line signals are also asserted during the read phase causing the select transistor 22 to be switched on. With the data value of "1" stored by the invertor pair 30, the discharge transistor 26 is switched on and the bit line signal discharges down towards ground (non-precharged signal value). The transition of the bit line signal value from "1" to "0" is accompanied by a corresponding transition in the output of the inverter pair 36 from "0" to "1". This in turn switches on the non-precharge state driver transistor 44 and switches off the precharge state driver transistor 42. The non-precharge state driver transistor 44 couples the input of the storage element 46 to ground causing it to a value of "0" (the Figure illustrates it as having previously had a value of "1"). The storage element 46 responses to this input and adopts a value of "1" at its output correctly reflecting the data value from the storage cell 18.

Figure 4:
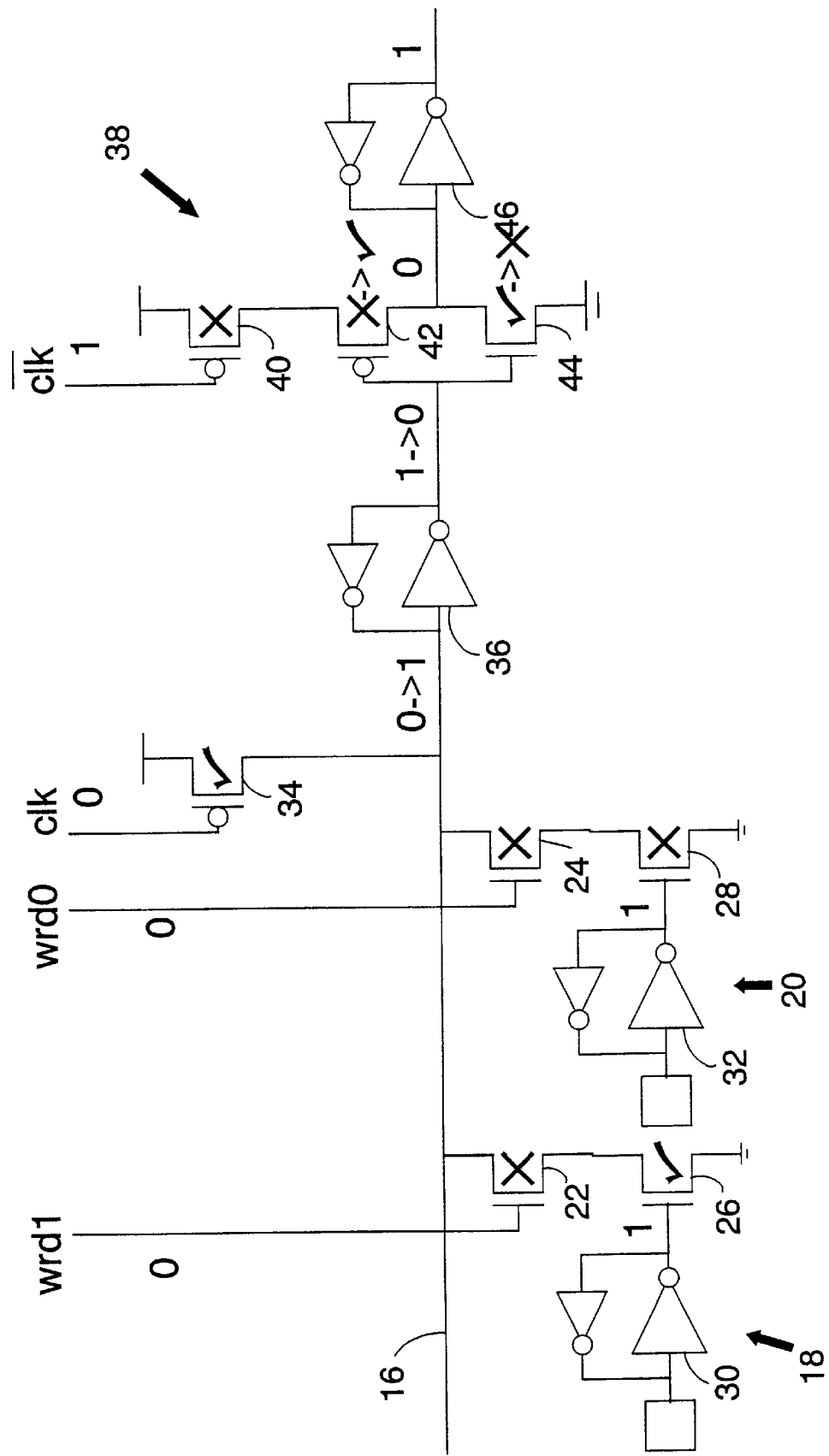

FIG. 4 illustrates the circuit of FIG. 3 precharging the bit line 16 following the reading of a data bit value of "1". The word line signals wrd0 and wrd1 are both switched off during this precharge period and the precharging transistor 34 is switched on. This restores the bit line signal value to "1" from its discharged value of "0". This change is reflected by the invertor pair 36 and in turn changes the input to the output buffer circuit 38 from a "1" to an "0". During the precharge period, the isolation transistor 40 is switched off. Thus, the transition of the precharge state driver transistor 42 from off to on does not change the output signal value of "0" being produced by the output buffer circuit 38. The non-precharge state driver transistor 44 also transitions from on to off during this period. It might be considered at the relatively slow switching of the transistors 42,44 in response to the slowly changing bit line signal during precharge could produce unwanted changes in the output signal of the output buffer circuit 38. However, since the single isolation transistor 40 removes the possibility of a change to a value of "1", the potential coupling of the output signal value to ground via the partially switched non-precharge state driver inverter 44 does not produce a problem since the output signal value is already "0".

FIG. 5 illustrates the reading of a data bit value "0" from the data storage cell 20. During the read period, the selection transistor 24 is switched on by the word line signal wrd0. The discharge transistor 28 is controlled by the data bit value "0" to remain switched off. Accordingly, the precharged signal value of "1" on the bit line 16 is not discharged. The output of the invertor pair 36 is accordingly a "0" which switches on the precharge state driver transistor 42 and switches off the non-precharge state driver transistor 44. During the read period, the isolation transistor 40 is switched on. Thus, a path is provided between the supply voltage and the input to the storage element 46 that causes the output of the output buffer 38 to change from an "0" to a "1". This in turn causes the output of the storage element 46 to change from a "1" to an "0" accurately reflecting the data bit stored within the data storage cell 20.

FIG. 6 illustrates the precharging of the bit line 16 following the reading of a "0". The precharging transistor 34 is switched on during the precharge period. The bit line signal value is already a "1" and so no transition occurs. The absence of a change in the bit line signal value means that no further changes occur downstream. The isolation transistor 40 is switched off during this precharge period and the non-precharge state driver transistor 44 is switched off by the output from the invertor pair 36 of a value "0".

Whilst the present invention has been described in the context of the reading of registers of a register bank, it will be appreciated that the invention could be used for many other memory circuits that include a bit line. For example, the invention could the used in a cache memory or a main memory. In addition, the polarities of the circuit elements could the reversed or changed in other complementary manners without altering the essence of the invention. Although a particular embodiment of the invention has been described herewith, it will be apparent that the invention is not limited thereto, and that many modifications and additions may be made within the scope of the invention. For example, various combinations of the features of the following dependent claims could be made with the features of the independent claims without departing from the scope of the present invention.

I claim:

1. An apparatus for processing data, said apparatus comprising:

(i) a plurality of data storage cells;

(ii) a bit line for reading a data value from a chosen one of said plurality of data storage cells;

(iii) a precharge circuit for precharging a bit line signal upon said bit line to a precharged signal value during a precharge period, said chosen data storage cell selectively discharging said bit line signal during a read period from said precharged signal value to a non-precharged signal value in dependence upon said data value stored in said chosen data storage cell; and (iv) an output buffer for generating an output signal on an output signal line in response to said bit line signal; wherein (v) said output buffer has a precharge state driver gate serving to drive said output signal to respond to said bit line signal having said precharged signal value during said read period and an isolation gate responsive to a signal indicative of said precharge period for disabling said precharge state driver gate from altering said output signal during said precharge period of said bit line; and (vi) said output buffer has a non-precharge state driver gate connected between said output signal line and a ground signal supply having a ground signal value with no intervening switched elements responsive to a different signal, said non-precharge state driver gate serving to drive said output signal to respond to said bit line signal having said non-precharged signal value during said read period and being responsive to said bit line signal changing from said non-precharged value to said precharged value to disable said non-precharge state driver gate from altering said output signal during said precharge period of said bit line.

2. An apparatus as claimed in claim 1, comprising a storage element for holding said output signal from said output buffer.

3. An apparatus as claimed in claim 1, comprising a plurality of said bit lines, said precharge circuits and said output buffers, each associated with a respective plurality of data storage cells.

4. An apparatus as claimed in claim 3, comprising a data processing core having a register bank formed of said data storage cells.

5. An apparatus as claimed in claim 4, wherein said register bank has a plurality of read ports each having an associated set of bit lines for reading a data value stored in a register of said register bank.

6. An apparatus as claimed in claim 1, wherein said signal indicative of said precharge period is a clock signal for said apparatus with a first phase of said clock signal defining said precharge period and a second phase of said clock signal defining said read period.

7. An apparatus as claimed in claim 6, comprising a plurality of said bit lines, said precharge circuits and said output buffers, each associated with a respective plurality of data storage cells and wherein each of said output buffers is controlled by a single clock signal.

8. An apparatus as claimed claim 1, wherein said precharge state driver gate and said isolation gate are p-type field effect transistors and said non-precharge state driver gate is an n-type field effect transistor.

9. An apparatus as claimed in claim 1, wherein apparatus is supplied with a supply voltage input with a supply voltage value and a ground voltage input with said ground signal value, said precharge signal value being said supply voltage value.

10. An apparatus as claimed in claim 1, wherein said apparatus comprises an integrated circuit.

11. A method of operating an apparatus for processing data having a plurality of data storage cells, said method comprising the steps of:

(i) reading a data value via a bit line from a chosen one of said plurality of data storage cells;

(ii) precharging a bit line signal upon said bit line to a precharged signal value during a precharge period, said chosen data storage cell selectively discharging said bit line signal during a read period from said precharged signal value to a non-precharged signal value in dependence upon said data value stored in said chosen data storage cell; and (iii) generating an output signal with an output buffer on a output signal line in response to said bit line signal; wherein (iv) driving, with a precharge state driver gate within said output buffer, said output signal to respond to said bit line signal having said precharged signal value during said read period and, with an isolation gate responsive to a signal indicative of said precharge period, disabling said precharge state driver gate from altering said output signal during said precharge period of said bit line; and (v) driving, with a non-precharge state driver gate connected between said output signal line and a ground signal supply having a ground signal value with no intervening switched elements responsive to a different signal and within said output buffer, said output signal to respond to said bit line signal having said non-precharged signal value during said read period, said non-precharge state driver gate being responsive to said bit line signal changing from said non-precharged value to said precharged value to disable said non-precharge state driver gate from altering said output signal during said precharge period of said bit line.

* * * * *